(12) United States Patent
Yoshioka

(10) Patent No.: US 8,006,205 B2
(45) Date of Patent: *Aug. 23, 2011

(54) SEMICONDUCTOR DEVICE LAYOUT METHOD, A COMPUTER PROGRAM, AND A SEMICONDUCTOR DEVICE MANUFACTURE METHOD

(75) Inventor: Keiichi Yoshioka, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 340 days.

This patent is subject to a terminal disclaimer.

(21) Appl. No.: 11/715,246

(22) Filed: Mar. 6, 2007

(65) Prior Publication Data

US 2007/0162885 A1    Jul. 12, 2007

Related U.S. Application Data

(62) Division of application No. 10/861,260, filed on Jun. 4, 2004, now Pat. No. 7,207,023.

(30) Foreign Application Priority Data

Jul. 23, 2003   (JP) ................................. 2003-200573

(51) Int. Cl.
*G06F 17/50* (2006.01)

(52) U.S. Cl. ......... 716/100; 716/110; 716/111; 716/119
(58) Field of Classification Search .................. 716/4–5, 716/9–13, 100, 106–107, 110–112, 119, 716/122

See application file for complete search history.

(56) References Cited

U.S. PATENT DOCUMENTS

| | | | |
|---|---|---|---|
| 4,855,803 A | 8/1989 | Azumai et al. | |
| 4,922,441 A | 5/1990 | Tsukagoshi et al. | |
| 5,161,229 A | 11/1992 | Yasui et al. | |
| 5,301,338 A | 4/1994 | Yamaura et al. | |
| 5,511,173 A | 4/1996 | Yamaura et al. | |
| 5,594,890 A | 1/1997 | Yamaura et al. | |
| 5,596,761 A | 1/1997 | Yoshioka et al. | |
| 5,606,709 A | 2/1997 | Yoshioka et al. | |
| 5,630,158 A | 5/1997 | Hara et al. | |
| 5,696,957 A | 12/1997 | Yamaura et al. | |
| 5,801,960 A * | 9/1998 | Takano et al. | 716/10 |
| 5,896,515 A | 4/1999 | Aota et al. | |
| 5,938,758 A | 8/1999 | Katayama et al. | |
| 6,266,756 B1 | 7/2001 | Hara et al. | |
| 6,266,762 B1 | 7/2001 | Aota et al. | |
| 6,461,877 B1 * | 10/2002 | Holloway et al. | 438/8 |
| 6,536,023 B1 | 3/2003 | Mohan et al. | |
| 6,651,236 B2 | 11/2003 | Ichimiya et al. | |
| 2001/0027513 A1 | 10/2001 | Yoshioka | |
| 2003/0085408 A1 * | 5/2003 | Yang et al. | 257/77 |

(Continued)

FOREIGN PATENT DOCUMENTS

JP    58-79736    5/1983

(Continued)

OTHER PUBLICATIONS

Dec. 24, 2008 official action in connection with a counterpart Japanese patent application No. 2003-200573.

*Primary Examiner* — Paul Dinh
(74) *Attorney, Agent, or Firm* — Cooper & Dunham LLP

(57) ABSTRACT

A semiconductor device layout method is disclosed, wherein vias carrying the same signal are arranged at intervals equal to the minimum value defined by a design rule, and vias carrying different signals are arranged at second intervals that are greater than the minimum value.

10 Claims, 7 Drawing Sheets

U.S. PATENT DOCUMENTS

| | | |
|---|---|---|
| 2003/0229866 A1* | 12/2003 | Allen et al. .................. 716/5 |
| 2004/0005775 A1* | 1/2004 | Chou et al. .................. 438/653 |
| 2004/0031004 A1 | 2/2004 | Yoshioka |
| 2006/0101367 A1 | 5/2006 | Fujita et al. |

FOREIGN PATENT DOCUMENTS

| | | |
|---|---|---|
| JP | 6-69339 | 3/1994 |
| JP | 7-37985 | 2/1995 |
| JP | 2001127162 | 5/2001 |

* cited by examiner

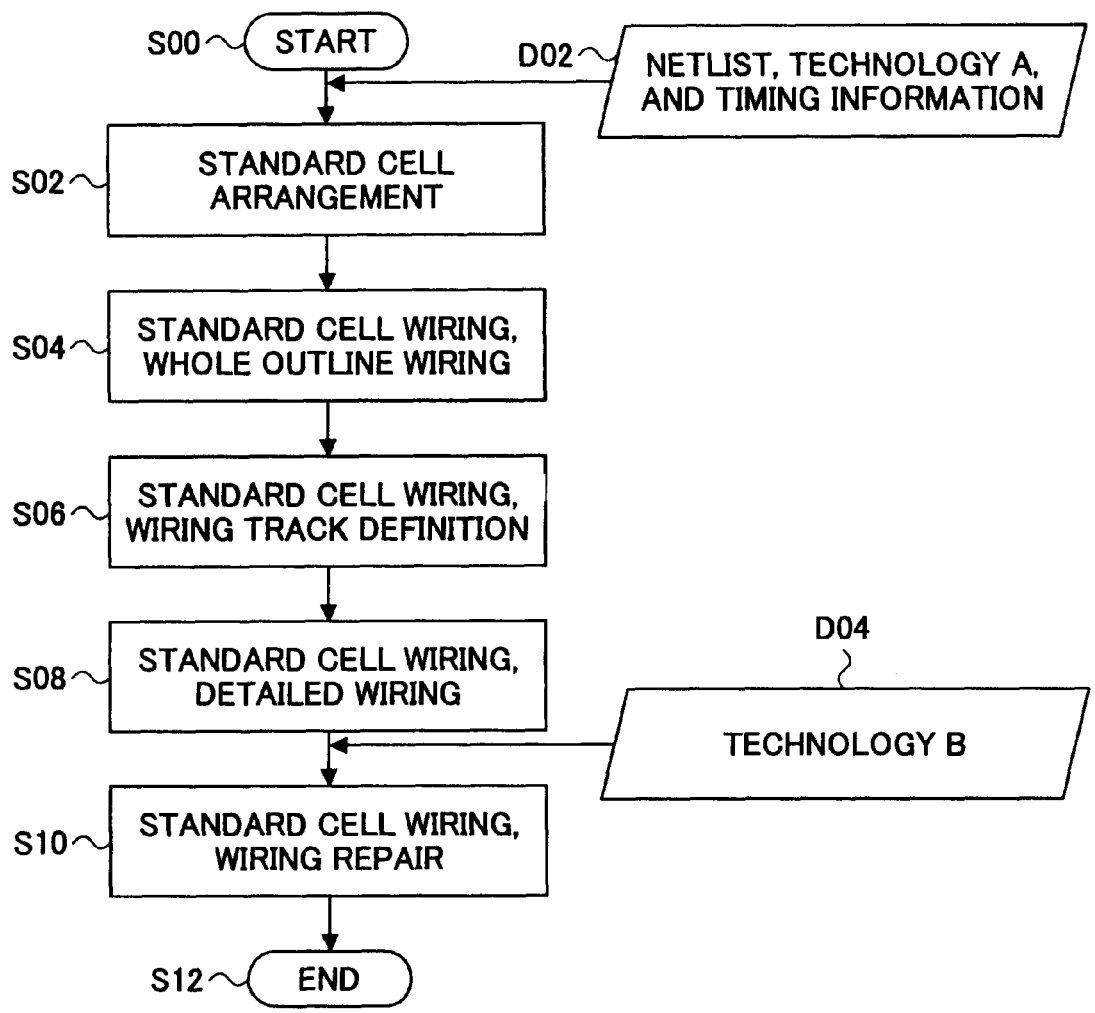

SEMICONDUCTOR DEVICE LAYOUT METHOD, A COMPUTER PROGRAM, AND A SEMICONDUCTOR DEVICE MANUFACTURE METHOD

CROSS-REFERENCE TO RELATED APPLICATION

This application is a divisional of U.S. Ser. No. 10/861,260, filed Jun. 4, 2004, now U.S. Pat. No. 7,207,023, the entire contents of which are hereby incorporated by reference herein.

BACKGROUND

1. Technical Field

This disclosure generally relates to wiring layout of a semiconductor device constituted by multi-layered wiring.

2. Description of the Related Art

An example of conventional multi-layered wiring of a semiconductor device is shown by FIGS. 5A-5D, which is designed by CAD (Computer Aided Design). As is well known, the multilayer is constituted by metal layers and via layers that are stacked one by one.

In the present specification, an n-th metal layer (n is a natural number), especially wiring thereof (metal portion) is expressed as "METALn layer", and an n-th via layer, especially a hole portion thereof, is expressed as "VIAn layer". As the number n increases, it signifies that the corresponding layer is positioned in the upper part of the semiconductor device.

Accordingly, connection between a METALn layer and a METALn+1 layer is established by hole means VIAn; connection between the METALn layer and an METALn−1 layer is established by hole means VIAn−1; connection between the METALn+1 layer and an METALn+2 layer is established by hole means VIAn+1; and so on.

With reference to FIGS. 5A-5D, a plan view of the METALn−1 layer, the METALn layer, and the VIAn−1 layer that connects the two metal layers is given at (a); a plan view of the METALn layer, METALn+1 layer, and the VIAn layer that connects the two metal layers is given at (b); and a plan view of the METALn+1 layer, the METALn+2 layer, and VIAn+1 layer that connects the two metal layers is given at (c). The structure shown by (c) is placed on the structure shown by (b) that is placed on the structure shown by (a). For easy reference, FIG. 7 provides a legend.

In FIGS. 5A-5D, a cross-sectional view of the device constituted by the structures shown at 5C, 5B, and 5A taken along a plane R is shown at 5D. Further, FIG. 6 is an enlargement of an approximately central part of the section enclosed by a single-dot chain-line shown at FIG. 5D.

According to the conventional example shown by FIGS. 5A-5D, a design rule is that the minimum value of the "width" of a wiring track and a hole in each layer is set to be the "interval" between wiring tracks and holes. That is, as indicated at FIG. 5A, the distance shown by "b" is the minimum value of the design rule. In FIGS. 5A-5D, all the wiring tracks and the holes are laid out with the minimum value width and at the minimum value intervals. In this manner, wiring in a metal layer is usually arranged using the minimum value width and the minimum value interval of the holes and the wiring tracks as far as possible.

However, in a layer material known as Low-K, and in a miniaturization process employing a Cu wiring process, a problem of a short circuit between VIAs occurring exists.

For example, in a process of dual damascene, the VIAn−1 layer and the METALn layer are simultaneously formed; the VIAn layer and the METALn+1 layer are simultaneously formed; and so on. Here, at places indicated by S and T of FIG. 6, peeling of the layer material often occurs due to imperfection of adhesion of the materials at the boundary region between the VIAn−1 layer and the METALn−1 layer, at the boundary region between the VIAn layer and the METALn layer, and so on. Peeling becomes remarkable with a film material of a low dielectric constant like the layer material known as Low-K. Further, since lower layers are exposed to heat stress a greater number of times than upper layers, the lower layers tend to have peeling.

In addition, in the case of a Cu wiring process, after a Cu layer is seeded in a damascene slot of dual damascene, the Cu layer is grown up, and Cu is embedded by a kind of plating means. At this time, Cu often permeates to a place where peeling takes place, given that Cu has a higher permeability than other conventional wiring materials such as Al. Consequently, the possibility exists that a short circuit will occur at the places S and T of FIG. 6.

Patent reference 1 (below) discloses a layout of a semiconductor integrated circuit employing a mesh-wiring power supply structure, wherein cross-talk is taken into consideration. According to the patent reference 1, the power supply mesh is forcibly provided at intervals of 2 widths of the wire in the perpendicular and the horizontal priority wiring directions such that signal wires are shielded. Accordingly, the interval between VIAs measures two widths of the VIA, and this is effective to prevent a short circuit from occurring between the VIAs. However, the double-width wiring interval definitely decreases density of the signal wires.

[Patent reference 1]
JP, 2001-127162, A

SUMMARY

In an aspect of this disclosure, there are provided a layout method for the semiconductor device, a computer program, and a semiconductor device manufacturing method that substantially obviate the problem of a short circuit between vias in a miniaturization process that employs a Low-K material and a Cu wiring process for producing a semiconductor device.

The present invention provides In an aspect of this disclosure, there is provided a semiconductor device layout method wherein vias carrying different signals are spaced at intervals greater than the minimum value defined by a design rule, while vias carrying the same signal are spaced at intervals of the minimum value.

The semiconductor layout method can further include vertically changing (displacing) the position of a via that is surrounded by vias, such that the surrounding vias can be arranged with the minimum value intervals.

The above-mentioned layout methods may be applied only to one or more selected layers, rather than being applied to all the layers.

In another aspect of this disclosure, there is provided a computer-executable program for implementing the above-mentioned layout methods.

In another aspect of this disclosure, there is provided a semiconductor manufacturing method that includes the above-mentioned layout method.

BRIEF DESCRIPTION OF THE DRAWINGS

FIG. 4 is a flowchart of software for automatic arrangement and wiring of a standard cell according to the fourth embodiment of the present invention;

DESCRIPTION OF THE PREFERRED EMBODIMENTS

In the following, embodiments of the present invention are described with reference to the accompanying drawings.

The First Embodiment

FIGS. 1A-1D show a part of a specific example of a design generated by a semiconductor device layout method using CAD according to the first embodiment of the present invention.

Figure 1C:
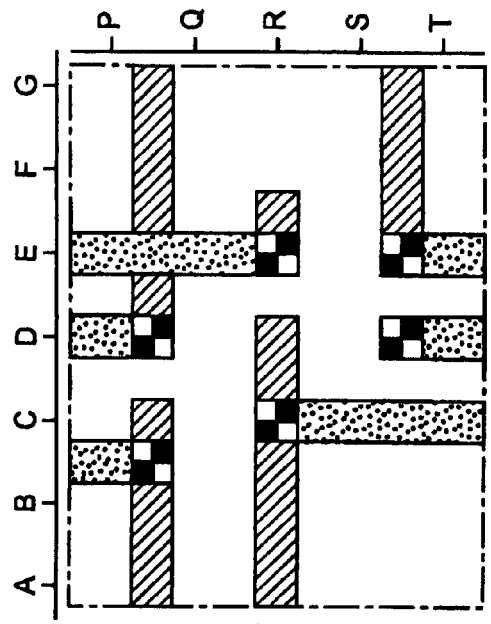
FIGS. 1A-1D show a part of a specific example of a design generated by a semiconductor device layout method using CAD according to the first embodiment of the present invention.
Figure 1D:
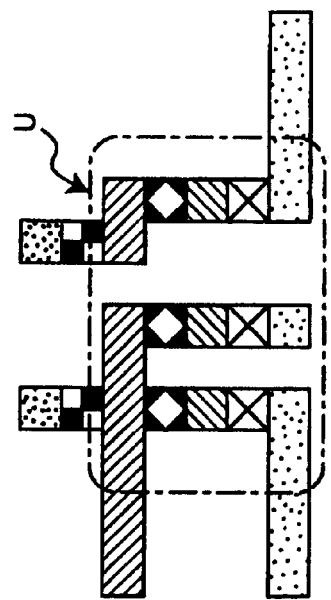
Figure 1A:
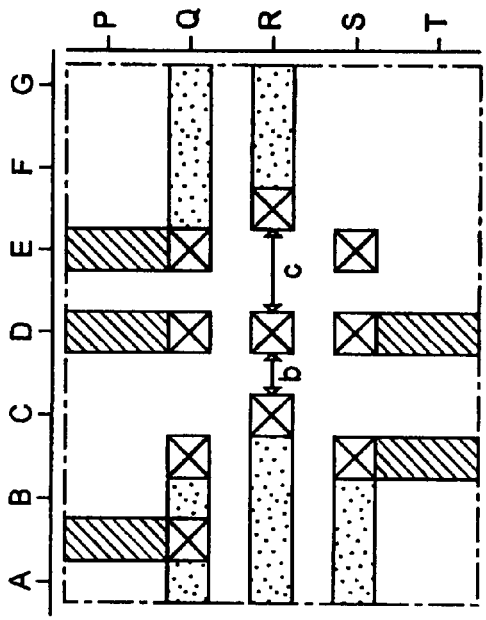
Figure 7:
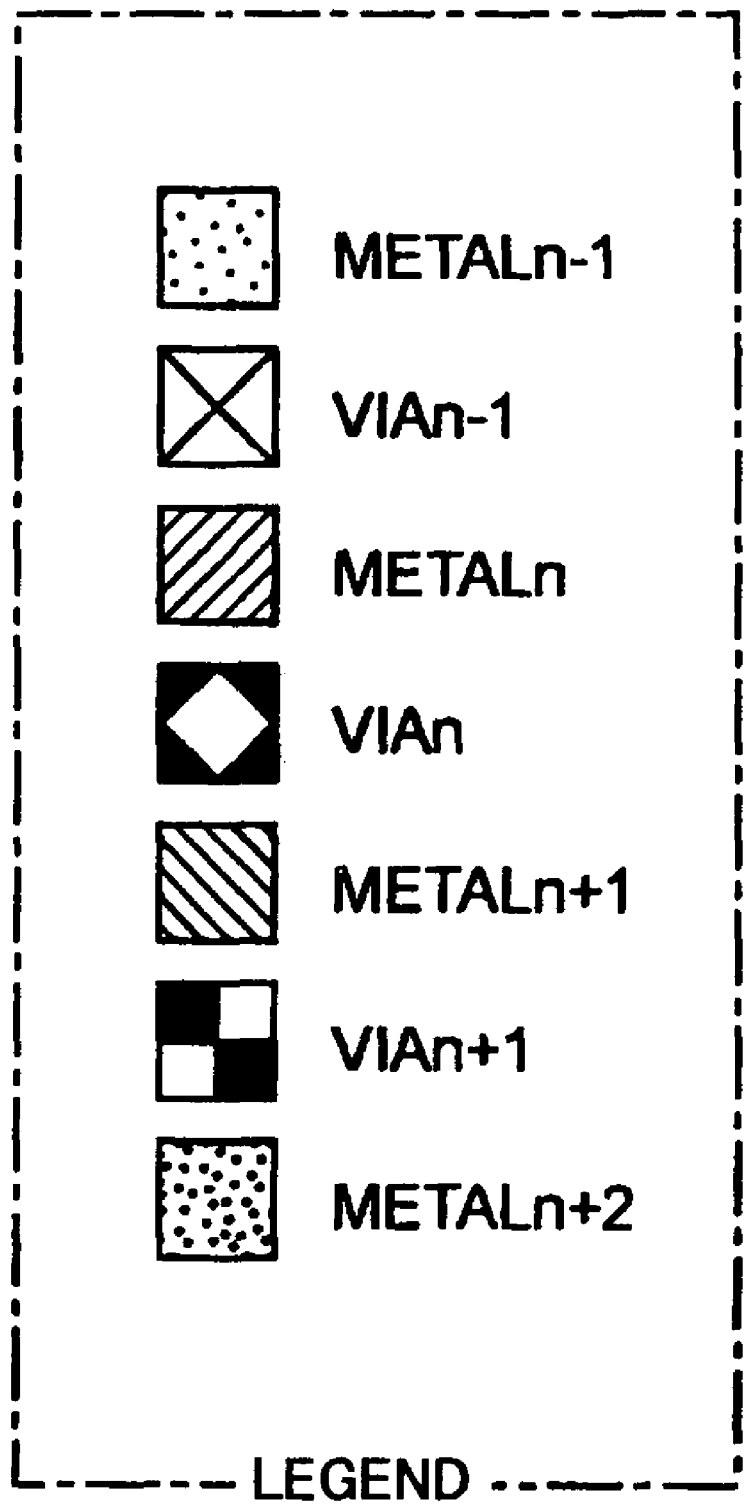
FIG. 7 is a legend indicating different marks for metal layers and via layers.

With reference to FIGS. 1A-1D, the METALn−1 layer, the METALn layer, and the VIAn−1 layer connecting the two metal layers are shown by a plan drawing at (a); the METALn layer, METALn+1 layer, and the VIAn layer connecting the two metal layers are shown by a plan drawing at (b); and the METALn+1 layer, METALn+2 layer, and VIAn+1 layer connecting the two metal layers are shown by a plan drawing at (c). At FIG. 1D, a cross-sectional view taken along a plane indicated by R of the layers shown at (c), (b), and (a) is given. Further, FIG. 2 is the enlargement of a part of the design shown at FIG. 1D, the part being delimited by a single-dot chain-line. In addition, FIG. 7 is a legend indicating correspondence between marks and layers, i.e., metal layers and via layers.

In the first embodiment, wiring tracks and holes of each layer are laid out according to the conventional method with an exception. Here, the conventional method is to set the same minimum value "b" to the minimum width of the wiring tracks and the holes, and to the intervals between the wiring tracks, and between the holes; and the exception is that VIAs for different signals are arranged at an interval "c", where "c" is set to be greater than "b". That is, the interval between VIAs for a first signal is "b"; and the interval between VIAs for a second signal is set at "c". In FIG. 1A, "c" is shown as being 50% greater than "b".

Figure 1B:
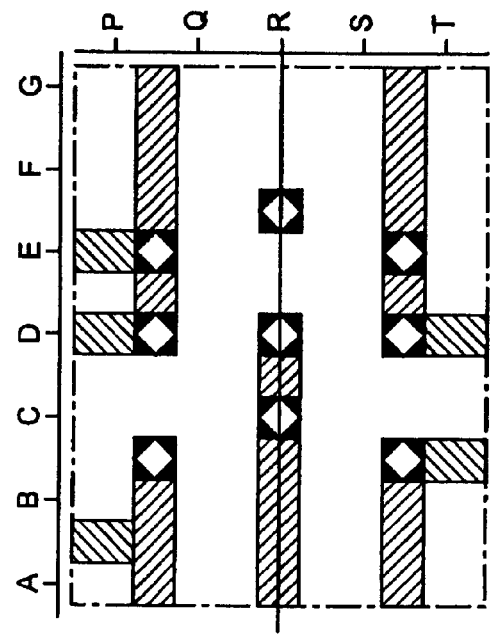
Figure 2:
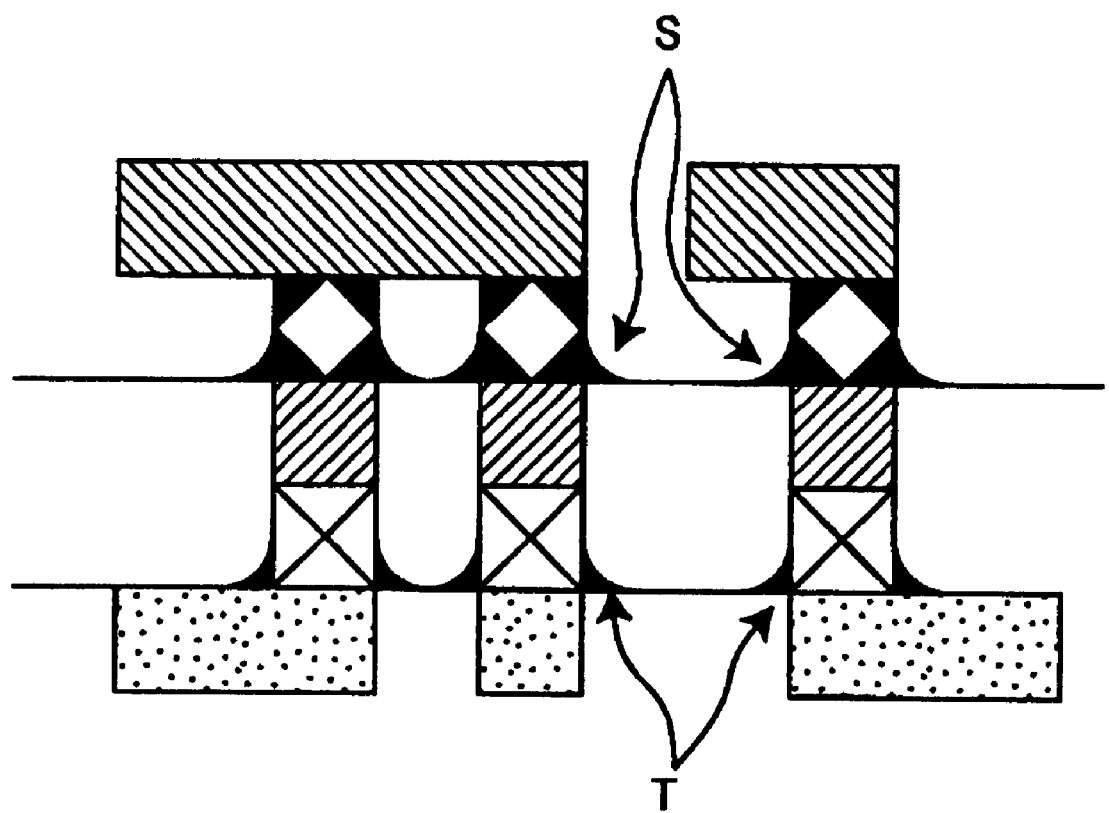
FIG. 2 is an enlargement of a part of the design shown at FIG. 1D, the part being delimited by a single-dot chain-line.

For example, three VIAs are considered with reference to a line indicated by R at FIGS. 1A and 1B. There, a VIA on the right and a VIA at the center are considered to carry different signals, and for this reason, the interval "c" is given between the two VIAs. Conversely, the central VIA and a VIA on the left are considered to carry the same signal, and for this reason, the interval "b" is given between these two VIAs. In this manner, even when peeling of the layer material occurs, and Cu (and the like) permeates to the places S and T of FIG. 2, the greater intervals provided between the VIAs that carry different signals remarkably reduces the possibility of causing a short-circuit.

The Second Embodiment

Figure 3A:
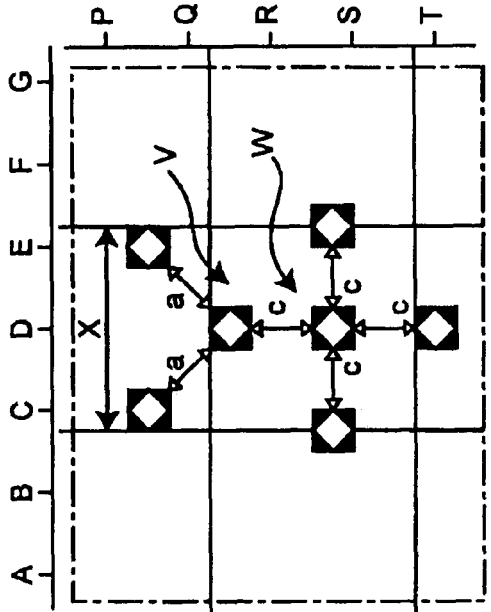
FIGS. 3A-3D show a part of a specific example of a design generated by a semiconductor device layout method using CAD according to the second embodiment of the present invention.
Figure 3B:
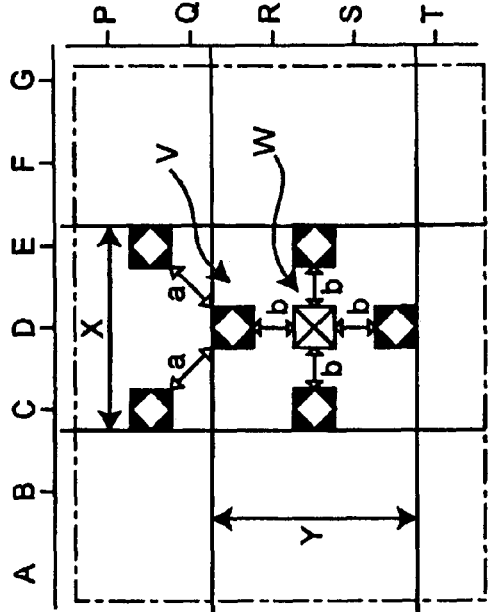
Figure 3C:
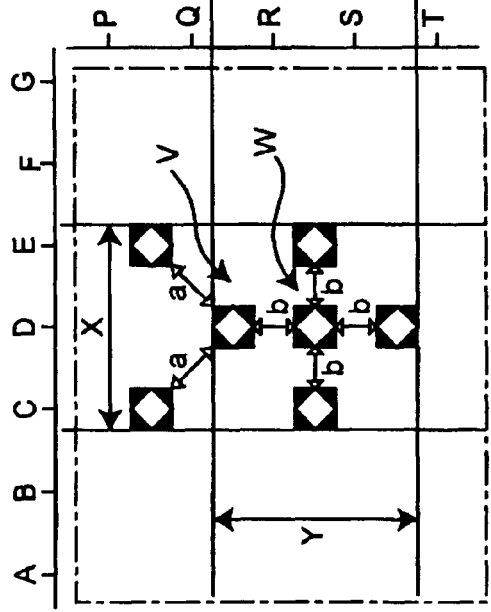
Figure 3D:
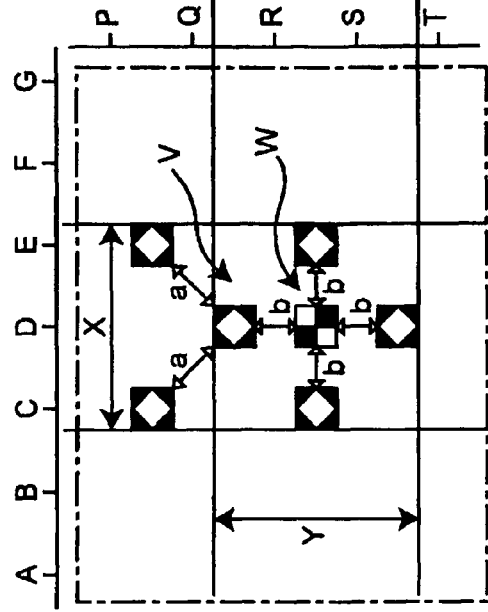
Figure 5A:
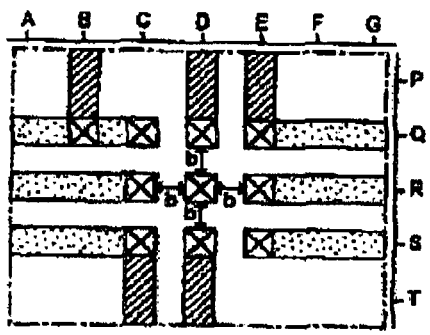
FIGS. 5A-5D show an example of wiring layout of a semiconductor device generated by CAD using conventional multi-layered wiring.
Figure 5C:
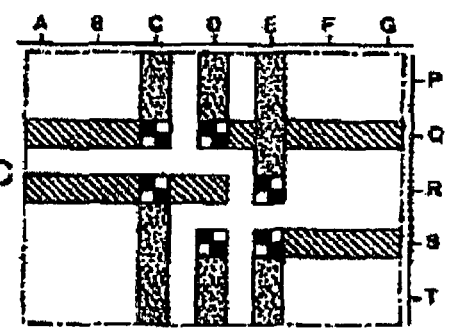
Figure 5B:
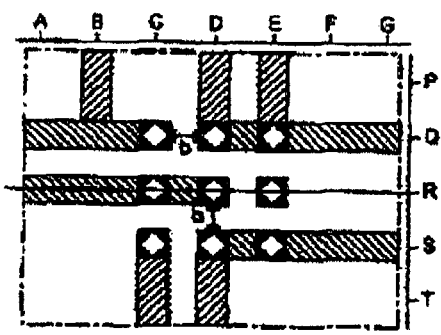
Figure 5D:
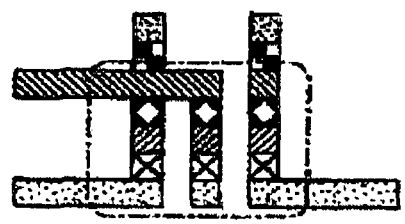
Figure 6:
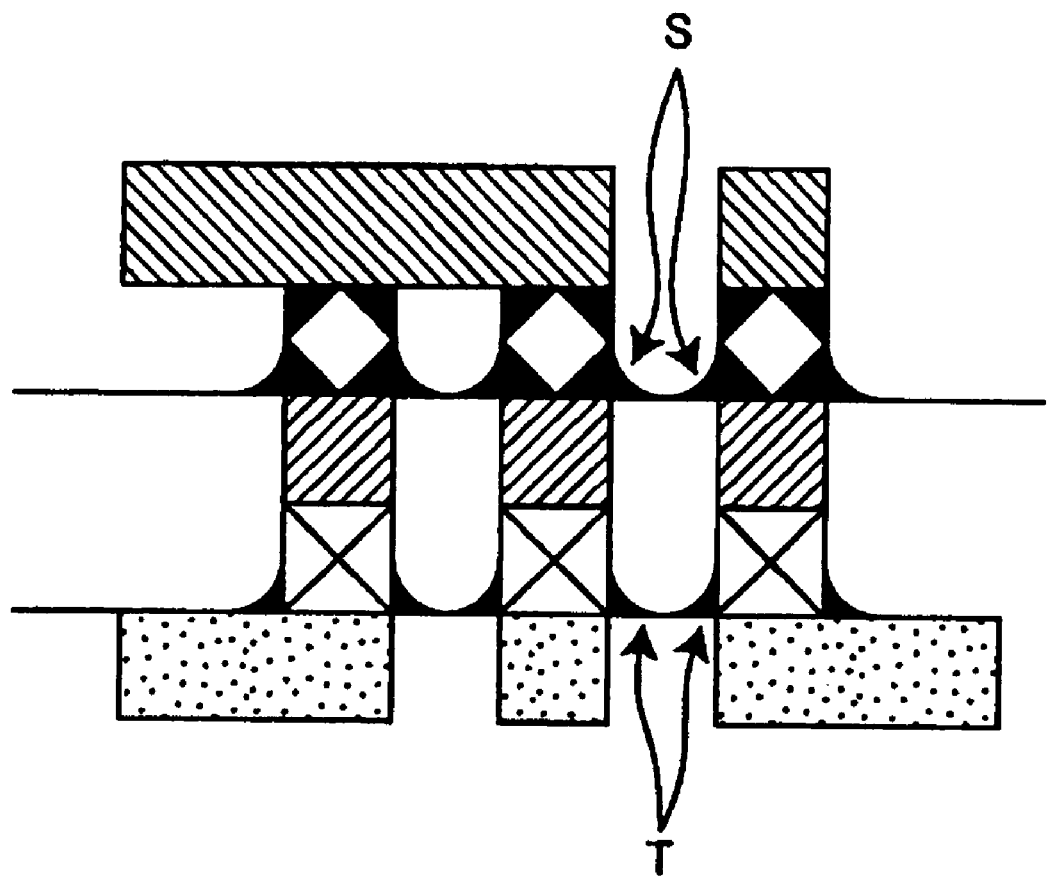
FIG. 6 is an enlargement of a part of the design shown at FIG. 5D, the part being delimited by a single-dot chain-line.

FIGS. 3A-3D, especially at FIGS. 3C and 3D, show a part of a specific example of a design generated by a semiconductor device layout method using CAD according to the second embodiment of the present invention. A process that results in the design is explained below.

A plan view at FIG. 3A shows an example of the conventional layout of the VIAn layer for connecting the METALn layer and the METALn+1 layer. Here, each VIA is considered to carry different signals. Therefore, these VIAs, which are laid out at the minimum value intervals "b", are to be spaced at a greater distance than the minimum value interval "b" if the first embodiment is implemented.

An interval between a VIA designated as V and each of two VIAs that are laid out at the top is equal to $"a"="2^{1/2} \times b"$ that is greater than the minimum value interval "b".

At FIG. 3B, four VIAs that surround a VIA designated as W are laid out at the interval "c" that is equal to $"1.5 \times b"$. That is, the layout at (b) is according to the first embodiment.

At (c), the VIAs are laid out according to the second embodiment. Here, the VIA designated as W is moved to the upper layer VIAn+1. With the minimal change of the layer position of the VIA W, the four VIAs that previously surrounded the VIA W can be spaced at the minimum value interval "b".

At (d), the VIAs are laid out according to the second embodiment. Here, the VIA designated as W is moved to the lower layer VIAn−1. With the minimal change of the layer position of the VIA W, the four VIAs that previously surrounded the VIA W can be spaced at the minimum value interval "b".

In this manner, that is, by moving one of plural VIAs vertically to the upper or lower layer, other VIAs can be spaced at the minimum value interval "b".

The Third Embodiment

The third embodiment of the present invention takes the following two points into consideration.

Namely, the first embodiment and/or the second embodiment do not have to be applied to all the layers of a semiconductor device.

Secondly, when processing multilayer metal wiring, a lower layer tends to be exposed to heat a greater number of times than an upper layer.

In view of above, the semiconductor device layout method according to the third embodiment applies the first embodiment and/or the second embodiment only to one or more lower layer wiring layers that experience the heat stress multiple times. In this manner, restrictions in laying out the upper layers other than the above-mentioned lower layers can be decreased.

The Fourth Embodiment

FIG. 4 is a flowchart of software for automatic arrangement and wiring of a standard cell according to the fourth embodiment of the present invention. As shown in FIG. 4, the software performs the arrangement and wiring of the cell based on a netlist, technology A that defines design rules (such as, a library and a wiring rule), and timing information for timing control (D02).

Specifically, standard cell arrangement is performed first (S02). Then, whole outline wiring for estimating wiring possibilities is carried out (S04), and definition of wiring tracks (S06) is carried out. Then, detailed wiring (S08) is carried out.

Further, as for minute violations of the design rule, a wiring repair process for correcting a non-connection and a short circuit is carried out (S10).

Now, in the case that any one of the first through the third embodiments is to be implemented, if a rule for selectively expanding the interval is applied to the technology A for steps S02 and S04, the definition of the wiring tracks at step S06 becomes confusing, and the convergence of the automatic wiring at steps S08 and S10 is remarkably degraded.

Therefore, according to the fourth embodiment, the contents of the technology A are not changed, i.e., are the same as the conventional method, and rule information of technology B for implementing one of the first through the third embodiments is provided (D04) between steps S08 and S10. In this manner, the interval of selected portions is expanded at step S10.

The automatic arrangement and wiring software of the standard cell is realized by a computer program that is to be installed in a computer system, which computer system has ordinary hardware such as a PC and a workstation.

Effect of the Invention

The following effects are obtained by using the present invention.

A short circuit between wires carrying different signals is prevented from occurring by providing a greater interval between VIAs that carry different signals, and as the result thereof, yield is improved. Further, according to the present invention, a short circuit of the same signal is permitted to occur such that the increase in wiring cost is minimized.

Since a VIA that is surrounded by plural VIAs is moved vertically, i.e., to an adjacent layer, up or down, the surrounding VIAs can be pulled back (resumed) to the minimum value interval, and the wiring cost increase is minimized.

Peeling often takes place at the lower part of a VIA due to the heat stress applied multiple times. This problem is lessened by the present invention by applying interval adjustment to one or more selected lower layers, rather than applying interval adjustment to all the layers such that the wiring cost increase is minimized.

In the process of automatic arrangement and wiring of a standard cell, the rule of the widened VIA interval is not applied to the original technology level, called technology A above; but rather, the original technology, i.e., the minimum value interval is used for the detailed wiring, and the widened interval, technology B, is introduced after the detailed wiring, which widened interval is applied to the wiring repair process. In this manner, confusion in wiring tracks is avoided, the convergence concerning the automatic wiring is maintained, and the time for executing the process is shortened.

Further, the present invention is not limited to these embodiments, but various variations and modifications may be made without departing from the scope of the present invention.

The present application is based on Japanese Priority Application No. 2003-200573 filed on Jul. 23, 2003, with the Japanese Patent Office, the entire contents of which are hereby incorporated by reference.

What is claimed is:

1. A non-transitory computer readable medium storing a program of instructions executable by a computer to perform a semiconductor device layout method, the method comprising:

arranging first vias that carry different signals at first spatial intervals between said first vias equal to a predetermined second value that is greater than a first predetermined value, the first vias being in a predetermined layer; and arranging second vias that carry the same signal at second spatial intervals between said second vias equal to the first predetermined value, the second vias being in the same predetermined layer, wherein each of an interval between a first pair of first vias and an interval between a second pair of first vias is equal to the same second predetermined value, and each of an interval between one pair of second vias and an interval between another pair of second vias is equal to the same first predetermined value.

2. The non-transitory computer readable medium as claimed in claim 1, wherein third vias of the semiconductor device, in an upper layer and a lower layer in reference to the predetermined layer of the semiconductor device, are arranged at third spatial intervals between said third vias equal to the minimum value, the third spatial intervals being measured horizontally in reference to a via in the predetermined layer of the semiconductor device.

3. The non-transitory computer readable medium as claimed in claim 1, wherein the semiconductor device layout method is applied only to one or more selected lower layers of the semiconductor device.

4. A non-transitory computer readable medium storing a program of instructions executable by a computer to perform semiconductor device manufacturing method, including a semiconductor device layout method, said semiconductor device layout method comprising:

arranging first vias of the semiconductor device that carry different signals at first spatial intervals between said first vias equal to a predetermined second value that is greater than a first predetermined value, the first vias being in a predetermined layer of the semiconductor device; and arranging second vias of the semiconductor device that carry the same signal at second spatial intervals between said second vias equal to the first predetermined value, the second vias being in the same predetermined layer of the semiconductor device, wherein each of an interval between a first pair of first vias and an interval between a second pair of first vias is equal to the same second predetermined value, and each of an interval between one pair of second vi as and an interval between another pair of second vias is equal to the same first predetermined value.

5. The non-transitory computer readable medium as claimed in claim 4, wherein third vias of the semiconductor device, in an upper layer and a lower layer in reference to the predetermined layer of the semiconductor device, are arranged at third spatial intervals between said third vias equal to the minimum value, the third spatial intervals being measured horizontally in reference to a via in the predetermined layer of the semiconductor device.

6. The non-transitory computer readable medium as claimed in claim 4, wherein the semiconductor device layout method is applied only to one or more selected lower layers of the semiconductor device.

7. A semiconductor device layout method, comprising:

arranging, using a computer, first vias, in a semiconductor device, that carry different signals at first spatial intervals between said first vias equal to a predetermined second value that is greater than a first predetermined value, the first vias being in a predetermined layer; and arranging second vias, in the semiconductor device, that carry the same signal at second spatial intervals between said second vias equal to the first predetermined value, the second vias being in the same predetermined layer, wherein each of an interval between a first pair of first vias and an interval between a second pair of first vias is equal to the same second predetermined value, and each of an interval between one pair of second vias and an interval between another pair of second vias is equal to the same first predetermined value.

8. The semiconductor device layout method as claimed in claim 7, wherein third vias of the semiconductor device, in an upper layer and a lower layer in reference to the predetermined layer of the semiconductor device, are arranged at third spatial intervals between said third vias equal to the minimum value, the third spatial intervals being measured horizontally in reference to a via in the predetermined layer of the semiconductor device.

9. The semiconductor device layout method as claimed in claim 7, wherein the semiconductor device layout method is applied only to one or more selected lower layers of the semiconductor device.

10. A semiconductor device, comprising:

first vias that carry different signals and are arranged at first spatial intervals between said first vias equal to a predetermined second value that is greater than a predetermined first value, the first vias being in a predetermined layer; and second vias that carry the same signal and are arranged at second spatial intervals between said second vias, equal to the predetermined first value, the second vias being in the same predetermined layer, wherein each of an interval between a first pair of first vias and an interval between a second pair of first vias is equal to the same second predetermined value, and each of an interval between one pair of second vias and an interval between another pair of second vias is equal to the same first predetermined value.

* * * * *